United States Patent [19]

Abbe et al.

[11] 4,353,029
[45] Oct. 5, 1982

[54] SELF INVERTING GAUGING SYSTEM

[75] Inventors: Robert C. Abbe, Newton; Noel S. Poduje, Needham Heights, both of Mass.

[73] Assignee: ADE Corporation, Watertown, Mass.

[21] Appl. No.: 125,989

[22] Filed: Feb. 29, 1980

Related U.S. Application Data

[62] Division of Ser. No. 877,332, Feb. 13, 1978, Pat. No. 4,217,542.

[51] Int. Cl.³ .............................................. G01R 33/12
[52] U.S. Cl. ...................................... 324/236; 324/62; 324/222; 331/65
[58] Field of Search ............ 324/222, 236, 327, 57 R, 324/62; 331/65

[56] References Cited

U.S. PATENT DOCUMENTS

| | | | |
|---|---|---|---|
| 3,597,687 | 8/1971 | Seipp | 324/236 |
| 3,634,875 | 6/1972 | Bixby | 324/117 R |
| 4,000,458 | 12/1976 | Miller et al. | 324/236 |

Primary Examiner—Ernest F. Karlsen
Attorney, Agent, or Firm—Weingarten, Schurgin & Gagnebin

[57] ABSTRACT

A self inverting gauging system for such parameters as capacitively sensed distance or inductively sensed resistivity in which the sensor provides an output inversely varying with the dimension of interest. The gauge typically includes a dual slope integrator responsive to a reference value on the up integration and to the sensor output on the down integration. The interval of the down integration necessary to reset the integrator to the original value varies directly, rather than inversely, with the dimension of interest and is typically provided as the digital output indication of a counter. In the application to resistivity gauging, the up integration reference signal is preferably provided by the output of a thickness gauge such that the ultimate counter display represents element resistivity compensated for thickness. To provide automatic error compensation two integrator loops are provided, one selectively closed around the dual slope integrator alone to provide a compensating reference for its errors, and the second, subsequently activated, to close an integration feedback loop around both the transducer and the dual slope integrator in order to provide a reference signal compensating for the errors of the entire system.

6 Claims, 4 Drawing Figures

SELF INVERTING GAUGING SYSTEM

This is a division, of application Ser. No. 877,332, now U.S. Pat. No. 4,217,542, filed Feb. 13, 1978.

FIELD OF THE INVENTION

The present invention relates to gauging circuitry processing electronics.

BACKGROUND OF THE INVENTION

In dimension gauging such as capacitive distance gauging, or inductive resistivity gauging, it is common to have the output of the capacitor or inductive sensor inversely representing the parameter of interest. For example, in the case of capacitive distance gauging, the output will vary inversely with the dimension forming the distance between the capacitive elements. For typical use in providing an output indication of the parameter of interest, the inversely varying sensor output is linearized or inverted before it is applied to a visual readout or other processing systems.

Systems are known which may be used to provide this inversion function, in particular those represented by our U.S. Pat. Nos. 3,805,150, 3,775,679 and 3,986,109, 3,990,005. While satisfactory, these systems involve additional electronic components to provide the inversion function.

In the case of resistivity measurement of an element, it is common to have an inductive eddy current sensor providing an output indication directly representative of conductance and at the same time inversely representative of resistance. It is again convenient to provide the ultimate output directly varying with the resistance gauged, and even more preferably, the resistivity necessitating a further mathematical manipulation to eliminate the dimensional variation.

In the present invention, this function is achieved by digitizing the sensor output in a dual slope integrator. The up integration is responsive to a first signal with which the resulting digitized output varies directly and the down integration is in response to a further signal, typically the sensor output, with which the digitized output varies inversely. As a result, the digitized output is made to vary directly with the ultimately desired parameter.

Dual slope integrators, as they are known in the art, generate cumulative offsets and other errors which can greatly reduce the accuracy. Therefore, a compensation feedback loop is often provided around the dual slope integrator with means for storing an analog representation of the error. This representation is provided as a compensating signal to the dual slope integrator. The thus compensated integrator, however, is still subject to other system errors. Accordingly, in a further aspect of the invention, a second closed loop is provided around the entire system from the transducer to the output of the dual slop integrator. This cooperates with the first loop to reduce entire system errors. The compensating systems are preferably activated in two distinct operating cycles. In the first, the dual slope integrator gauging function alternates with a compensation interval provided by the first closed integrator loop around the dual slope integrator. This cycle provides actual gauge operation for the detection of a desired dimension. Alternating with this cycle is a calibration cycle in which the first closed loop is enabled in alternation with the second feedback loop around the entire system. This latter cycle typically occurs during intervals of sensor inactivity between dimension readings.

BRIEF SUMMARY OF THE INVENTION

The present invention provides a gauging system in which a sensor output having a signal varying inversely with a desired parameter is applied to a dual slope integrator-digitizer, as the signal which is down integrated. The resulting digitized output provides an indication directly varying with the dimension gauged. Additionally, in the case of resistivity measurements, the up integration is made responsive to the output of a thickness gauge such that the digitized output represents resistivity, or resistance compensated for actual element thickness.

Additionally, the invention provides a system for automatically cancelling errors typically associated with integrating circuitry and particularly associated with high sensitivity dimension gauging systems. The cancellation or compensation circuitry includes cooperative first and second feedback loops, selectively closed around the integrating portion of the gauging system alone and the entire gauging system. In this manner, the errors of the dual slope integrator may be initially minimized and with these reduced to a minimum, the second loop is effective to compensate for errors in the entire system. The compensation provided during operation of the two loops is then maintained during intervals when the loops are opened for actual sensor operation.

DESCRIPTION OF THE DRAWING

These and other features of the present invention are more fully set forth below in the exemplary and nonlimiting detailed description of the preferred embodiment and the accompanying drawing of which.

DETAILED DESCRIPTION OF THE INVENTION

The present invention contemplates a self inverting gauging system in which the output of the sensor such as a capacitive dimension gauge or inductive resistivity gauge is electrically processed to provide inherent signal inversion such that the ultimately provided output, typically in digital form, varies directly with the dimension gauged.

Figure 1:
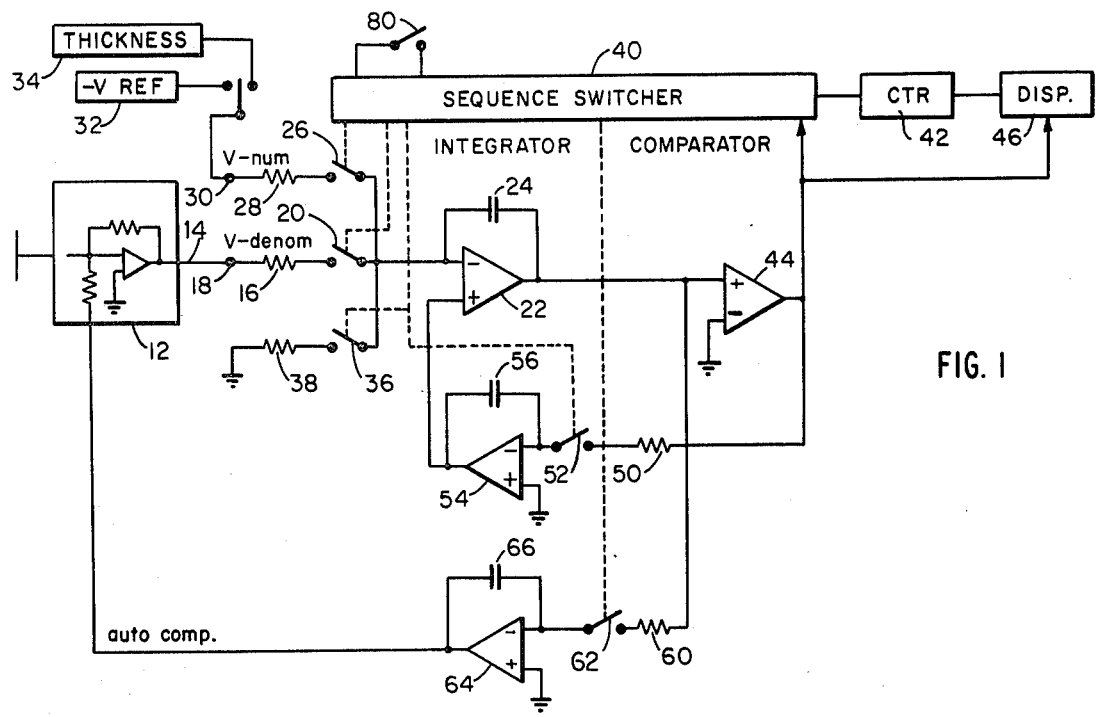
FIG. 1 is a circuit diagram of the self inverting gauging system of the present invention.

With reference now to FIG. 1, a circuit according to the invention is illustrated. As shown there, a transducer 12 is provided which, in the case of capacitive dimension gauging, may be of the type shown in U.S. Pat. No. 3,706,919, commonly assigned herein and incorporated by reference. In the case of resistivity gauging, a sensor of the type illustrated in FIG. 3 and described below may be employed. The sensor or transducer of this type has an output on a signal line 14 which is typically a voltage or current magnitude that varies inversely with the dimension, capacitively gauged distance or element resistance and resistivity desired. This signal is applied through an input resistor 16 at a terminal 18 of the processing electronics. The terminal 18 is defined as the denominator voltage. The signal at this terminal 18 is applied through a switch 20 to the inverting input of an operational amplifier 22 having an integration capacitor 24 connected between its output and the inverting input.

The inverting input of the operational amplifier 22 also receives a signal selectively applied through a switch 26 and input resistor 28 from a further switch 30 that is connected either to a voltage reference 32 or, in the case of resistivity measurements, a thickness gauge 34. The thickness gauge 34 may be of any desired type, such as mechanical or electrical, but is preferably of the type illustrated in our U.S. Pat. No. 3,990,005, incorporated herein by reference. Additionally, the inverting input of the operational amplifier 22 is grounded selectively through a switch 36 and balancing resistor 38.

Figure 2A:
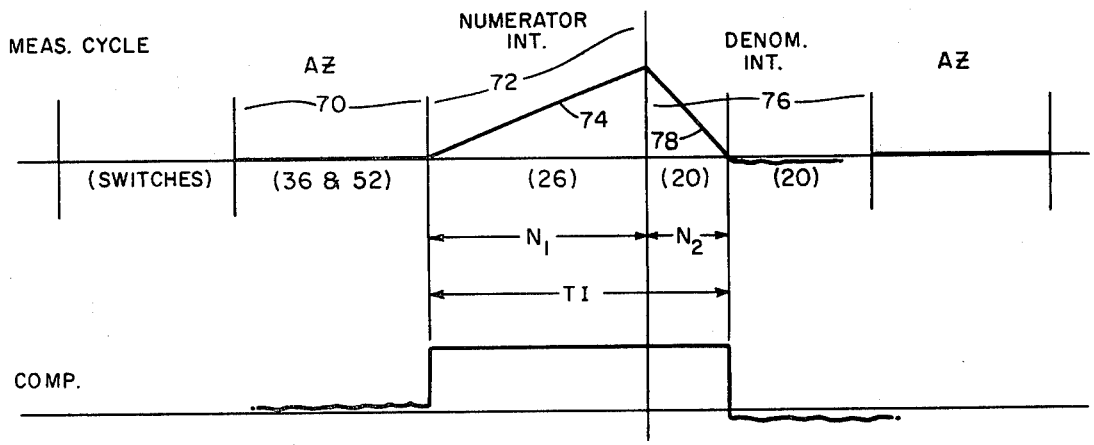
FIGS. 2A and 2B are timing diagrams useful in explaining the operation of the present invention.
Figure 2B:
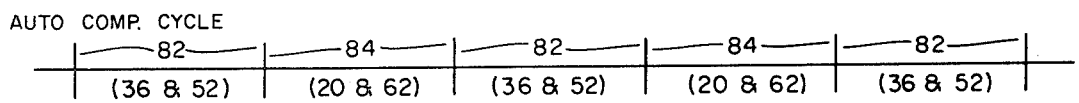

The switches 20, 26 and 36 are controlled by a sequence switcher 40, typically a counter having a set of intervals as is indicated in FIGS. 2A and 2B, described below, to provide a predetermined sequencing of switch closures. The switch 26 is typically closed first to apply the reference voltage 32 through the switch 30 and resistance 28 to the operational amplifier 22 causing the output to integrate or slew up at a rate dependent upon the voltage of the reference 32, typically designated as V numerator, scaled by the values of the capacitor 24 and resistor 28. The sequence switcher 40 times the interval during which this up integration is performed, an interval designated $N_1$ within an integration interval TI in FIG. 2A, after which the sequence switcher opens the switch 26 and closes the switch 20, as well as enables a counter 42 connected to a display 46 for the count magnitude. This connects the output of the transducer 12 to the inverting input of the operational amplifier 22 which, by proper selection of polarity, will cause the integrator to slew downward. A comparator 44 is provided on the output of the operational amplifier 22 to identify when the amplifier output reaches a threshold from which up integration began, typically the zero level. The switching comparator state is a trigger signal applied to the sequence switcher 40 causing the counter 42 to stop at the value representing the time interval $N_2$ during the down integration. This value may then be applied to display 46 providing a digital indication of the parameter being sensed.

This results in displaying a value proportional to the mathematical relationship that equates the interval of time $N_2$ to the product of the interval of time $N_1$ and V numerator divided by the quantity V denominator. In the case of a typical capacitive gauge, the value V denominator increases with the sensed capacitance but since capacitance is in itself an inverse function of the dimension ultimately desired, V denominator will vary inversely with the desired dimension. From the processing electronics of the dual slope integrator digitizer, however, it can be seen that the capacitance sensed by the transducer 12 will appear in the denominator of the mathematical relationship governing the displayed output and as a result the gauged dimension will itself appear in the numerator. This provides a direct proportional variation between gauged dimension and displayed output.

In the case of a resistivity gauge employing an inductive eddy current resistance detector of the type described below, the resistivity transducer output will vary directly with the conductance of the element being sensed. Conductance, however, varies inversely with resistance and accordingly by applying the conductance representing signal to the V-denominator input, the resistance representing parameter can be made to appear in the numerator of the equation governing the displayed quantity. Again, the output indication is made to vary directly with the desired resistance.

Where actual element resistivity is desired its thickness must be accounted for. Accordingly, the switch 30 in this case is connected to apply the output of the thickness gauge 34, varying directly with thickness, as the V numerator input to the dual slope integrator through the switch 26. Since resistivity of a material is the thickness divided by the conductance of the sample, by placing the thickness representing signal at the numerator input, and recognizing that the resistivity gauge transducer provides an output signal varying directly with conductance, it can be seen that the desired division is automatically achieved without the need for additional processing electronics.

The output of the comparator 44 is further applied through a resistor 50 and selectively closed switch 52 to the inverting input of an operational amplifier 54 having an integration feedback capacitor 56 connected from the output to the inverting input. The output of the operational amplifier 54 is then connected to a noninverting input of the operational amplifier 22. With the switch 52 closed, a feedback loop is established around the operational amplifier or dual slope integrator alone which causes the operational amplifier 54 to integrate to a point where its net input is zero, the point where the comparator 44 is just at its threshold for the commencement of integration. This value is achieved with an output from the operational amplifier 54 established by the charge on the capacitor 56. Depending upon the size of the capacitor 56, this output may be maintained for a period of time. With a sufficiently sizeable capacitor the same charge can be maintained for at least a single up/down integration by the operational amplifier 22 before a significant loss in the compensating signal is noted. This compensating signal eliminates all errors from the dual slope integrator of the offset variety which would impair its accuracy by altering the point from which up integration began and at which down integration terminated.

Other system errors are, however, present. A further feedback loop is provided from the output of the operational amplifier 22 through an input resistor 60, through a selectively closed switch 62 to an inverting input of an operational amplifier 64 having an integration feedback capacitor 66 connected between its output and the inverting input. The output of the operational amplifier 64 is applied to the transducer 12 at a summing junction for the output signal therefrom. In the case of an inductive resistance sensor, this is as illustrated and described below with respect to FIG. 3. In the case of a capacitance dimension gauge of the type noted above, the offset signal may be applied directly into the output lead through a resistor to provide a current summing mode of operation. Capacitor 66 stores the error compensating signal in the same way as capacitor 56. It should be noted that either integrators 54 or 64 may be digital integrators.

The feature of the invention by which errors are eliminated through the dual action of both feedback loops may now be best understood by reference to FIG. 2A, showing the timing cycle and accordingly the logic states for the sequence switcher 40. In a first interval of time 70, the switches 36 and 52 are closed with the others remaining open in order to connect the loop through the operational amplifier 54 around the dual slope integrating amplifier 22. The interval 70 need only be sufficient to charge the capacitor 56 to the point where the comparator 44 is maintained at the threshold state.

Directly subsequent thereto, an interval 72 is entered in which all switches are open except for the switch 26 connecting the numerator voltage to the operational amplifier 22. During this period, the output of the operational amplifier 22 has an upward sloping integration waveform 74 which lasts for an interval $N_1$ defined by the counter within the sequence switcher 40.

At the expiration of the interval $N_1$, a further time period 76 is provided during which the switch 20 is closed, all others being opened. In this interval 76, the dual slope integrator of operational amplifier 22 slews downwardly in accordance with the waveform 78 and at a rate dependent upon the value of the V denominator input. When this waveform 78 reaches the threshold level defined by the comparator 44, the trigger signal provided by the comparator to the sequence switcher 40 disables further counting by the down slope counter 42 and enables the display 46 to indicate a number corresponding to the count state of the counter 42. Magnitude scaling, either digitally in the counter 42 or elsewhere in the circuit, may be employed in order to provide a displayed output in a predetermined scale factor corresponding to the gauged dimension.

The interval 76 typically lasts a significant time beyond the interval defined by $N_2$ in order to accommodate a very large dynamic range in the denominator inputs of which the present invention is inherently capable as opposed to the far more limited dynamic range characterized by analog division circuitry systems. Thereafter, the cycle of intervals 70, 72 and 76 is repeated.

A further processing cycle, defined by the sequence switcher 40 and identified in FIG. 2B, is triggered by a switch 80 being manually or otherwise connected from a first condition to cause the cycle of FIG. 2A to occur to a second state in order to cause the cycle of FIG. 2B to occur. In accordance with the cycle of FIG. 2B, alternating time intervals 82 and 84 are provided in a continuous succession. In the interval 82, the switches 36 and 52 are closed with the other switches remaining open to provide the compensating function similar to that of the interval 70. At least one interval 82 must be achieved before an interval 84. In interval 84, the switches 20 and 62 are closed with all others remaining open. The transducer is then oriented by the operator to read a reference dimension such as infinite distance or resistance. In this mode, the operational amplifier 64 is connected in a closed loop around the entire system, again forcing the output of the integrator operational amplifier 22 to a threshold condition for the system and storing in the integration capacitor 66 a charge which insures the appropriate output from the amplifier 64 to the transducer 12 to maintain this condition. Normally, a single cycle of intervals 82 and 84 is sufficient to set up these conditions, but it is simplest and preferable to let them continue to alternate in the compensating mode of switch 80 until it is desired to reset the switch to the sequence of FIG. 2A for actual measurement.

Figure 3:
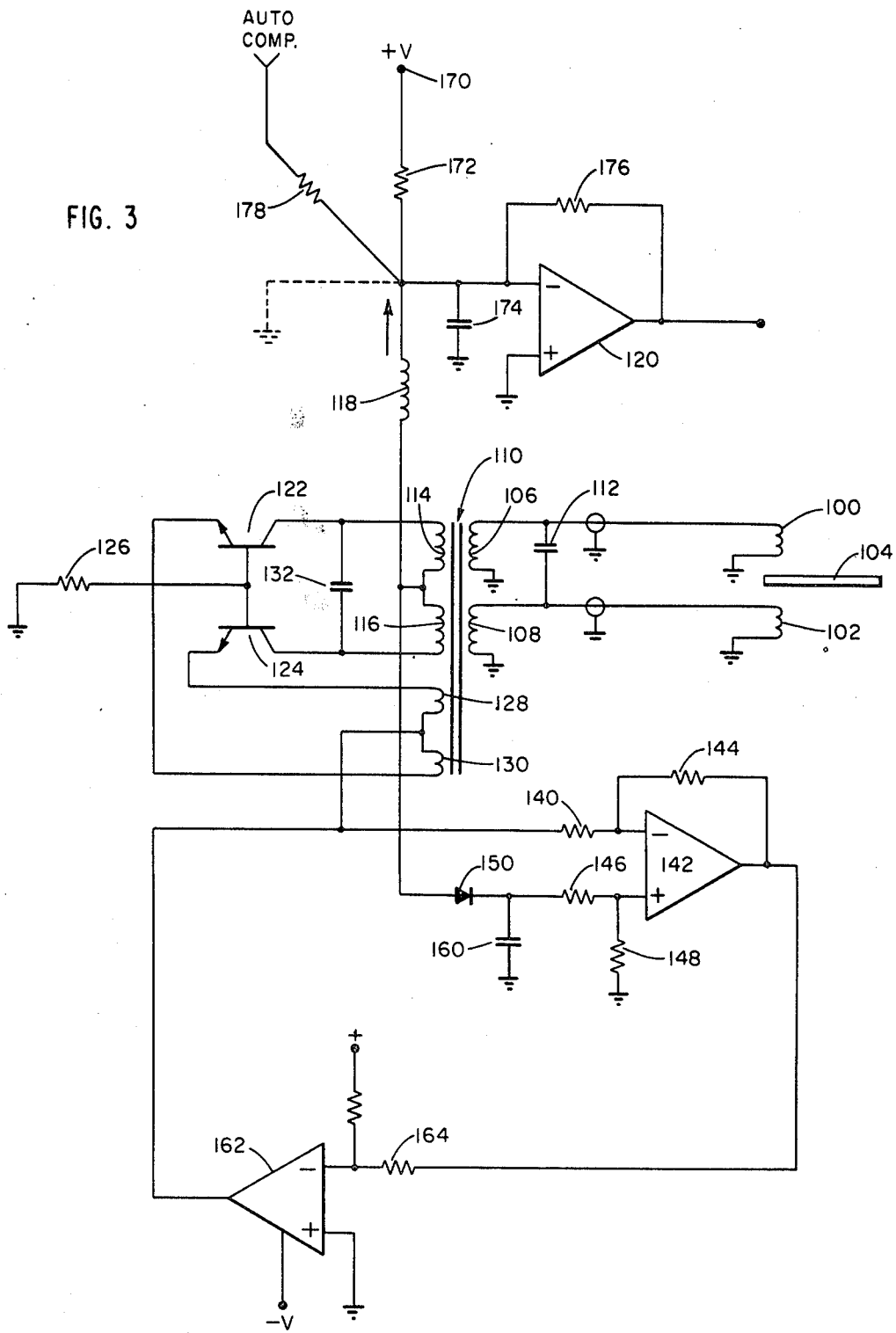
FIG. 3 is a schematic diagram for a resistivity sensor useful in the present invention.

With reference now to FIG. 3, there is shown an example for a transducer 12 of the type useful in making element resistivity measurements. As shown there, first and second inductively coupled coils 100 and 102 are provided on either side of an element 104 such as a semiconductor silicon wafer, the resistivity of which it is desired to measure. The coils 100 and 102 are provided in a polarization to combine the flux of each through the element 104. The coils 100 and 102 are each excited by corresponding secondary coils 106 and 108 of a transformer 110 which have, preferably, connected thereacross a capacitor 112, tuned to resonance at an excitation frequency for the transformer 110 primary.

The primary of the transformer 110 is composed of first and second coils 114 and 116 which are center connected and applied through a inductor choke 118 to a virtual ground provided at the inverting input of an operational amplifier 120. The opposite sides of the coils 114 and 116 are applied to respective collectors of transistors 122 and 124. The bases of the transistors 122 and 124 are connected in common through a resistor 126 to ground, while the bases are connected to opposite sides of respective regenerative pick-off coils 128 and 130 of the transformer 110. The circuitry of the transistors 122 and 124 is connected in conventional oscillator configuration which is tuned by a capacitor 132 across the series connection of coils 114 and 116. Regeneration to insure oscillation is provided by the pick-off coils 128 and 130 which emitter couple feedback to transistors 122 and 124 from the tank circuit of the coils 114 and 116.

The pick-off coils 128 and 130 have their other terminals connected in common through a resistor 140 to an inverting input of an amplifier 142. The gain of amplifier 142 is determined by a negative feedback resistor 144 connected therearound. The non-inverting input of the amplifier 142 is applied through a voltage divider combination of a resistor 146 and a resistor 148 from a simple rectifier consisting of a single diode 150, connected to the center point of coils 114 and 118 which charges a capacitor 160. The output of the amplifier 142 is applied to an inverting input of a further amplifier 162 through an input resistor 164 with the output of the amplifier 162 applied back to the common junction of the coils 128 and 130.

In operation, the circuitry of amplifiers 142 and 162 stabilizes the value of the signal coupled by the coils 100 and 102 into the element 104, varying instead the oscillator drive current drawn through the inductive choke 118 from the virtual ground input of the amplifier 120. This current is balanced by power taken out of a voltage source 170 through a resistor 172 to maintain the same virtual ground at the inverting input of the amplifier 120. A capacitor 174 is connected across this input to ground to reduce the AC ripple at the frequency of oscillation of the transistors 122 and 124. The amplifier 120 has a feedback resistor 176 to provide sufficient current feedback to insure the condition of a virtual ground under whatever power demands are placed upon the oscillator circuit. A further input through a resistor 178 is provided from the output of the operational amplifier 64 of FIG. 1 as the total system error compensation feedback signal. The output of amplifier 120 thus measures the value of the oscillator D.C. drive which is related to the flux in element 104.

The above-described preferred circuitry of the present invention is intended as exemplary only, alterations and modifications of this circuitry are intended to fall within the scope of the invention as defined only in accordance with the following claims.

What is claimed is:

1. A conductance gauging system for the conductance of an element comprising:
   a pair of transistors;
   a center tapped transformer primary in the collector circuit of said transistor pair;

means for driving said transistors through the center tap;

a center tapped transformer secondary in the base-emitter circuit of said transistor pair to provide regenerative feedback;

means for maintaining a predetermined signal level between the center taps of said primary and secondary;

a resonant circuit responsive to the signal across said primary to apply a flux to said element; and means for detecting the drive applied to said transistor pair as an indication of element conductance.

2. The conductance gauging system of claim 1 wherein said resonance circuit includes first and second transformer secondary coils coupled to receive excitation from said transformer primary; and first and second flux inducing coils responsive to excitation of said first and second transformer secondaries to apply flux through said element in the same sense.

3. The conductance gauging system of claim 1 or 2 wherein said means for maintaining a predetermined signal level includes:

means for applying excitation power to said pair of transistors through the center tap of said transformer primary; and means for varying the level of excitation provided to said pair of transistors to maintain said predetermined signal level between said center taps whereby the flux applied to said element is stabilized.

4. The conductance gauging system of claim 3 wherein said means for varying the excitation applied to said pair of transistors further includes:

a differential amplifier for responding on an inverting input to the center tap of said transformer secondary and on a non-inverting input to an average value of the signal on said transformer primary center tap; and means for inverting the output of said differential amplifier and reapplying the inverted output to the inverting input of said differential amplifier.

5. The conductance gauging system of claim 3 further including:

means responsive to said excitation for providing an indication of conductance of said element.

6. The conductance gauging system of claim 5 wherein said excitation applying means includes:

means for applying a variable current to said transistor pair from a point of virtual ground; and means for maintaining said virtual ground.

* * * * *